United States Patent
Chang et al.

(10) Patent No.: US 12,027,204 B2
(45) Date of Patent: Jul. 2, 2024

(54) MEMORY INCLUDING METAL RAILS WITH BALANCED LOADING

(71) Applicant: Taiwan Semiconductor Manufacturing Company Ltd., Hsinchu (TW)

(72) Inventors: Meng-Sheng Chang, Hsinchu (TW); Chia-En Huang, Hsinchu (TW); Yi-Ching Liu, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/357,785

(22) Filed: Jul. 24, 2023

(65) Prior Publication Data

US 2023/0368837 A1    Nov. 16, 2023

Related U.S. Application Data

(62) Division of application No. 17/460,206, filed on Aug. 28, 2021, now Pat. No. 11,854,616.

(51) Int. Cl.
| | |
|---|---|
| *G11C 7/10* | (2006.01) |
| *G11C 8/08* | (2006.01) |
| *G11C 8/10* | (2006.01) |
| *G11C 13/00* | (2006.01) |

(52) U.S. Cl.
CPC ........ *G11C 13/004* (2013.01); *G11C 13/0026* (2013.01); *G11C 13/0028* (2013.01); *G11C 13/003* (2013.01)

(58) Field of Classification Search
CPC ............ G11C 13/0069; G11C 13/0026; G11C 13/0028; G11C 13/004; G11C 2013/0078; G11C 2013/0092; G11C 2213/79; G11C 16/10; G11C 16/08; G11C 16/24; G11C 16/30; G11C 7/1096; G11C 7/1069; G11C 7/12; G11C 8/08; G11C 11/165; G11C 11/407; G11C 17/18; G11C 11/221; G11C 11/2255; G11C 11/2257; G11C 11/2259; G11C 13/003; G11C 11/5678
See application file for complete search history.

(56) References Cited

U.S. PATENT DOCUMENTS 11,521,663 B2 * 12/2022 Liu ................... G11C 16/0483
11,776,595 B2 * 10/2023 Yuh ..................... G11C 7/1069
                                                                  365/96

(Continued)

*Primary Examiner* — Hien N Nguyen
(74) *Attorney, Agent, or Firm* — FOLEY & LARDNER LLP

(57) ABSTRACT

Disclosed herein are related to a memory array. In one aspect, the memory array includes a set of resistive storage circuits including a first subset of resistive storage circuits connected between a first local line and a second local line in parallel. The first local line and the second local line may extend along a first direction. In one aspect, for each resistive storage circuit of the first subset of resistive storage circuits, current injected at a first common entry point of the first local line exits through a first common exit point of the second local line, such that each resistive storage circuit of the first subset of resistive storage circuits may have same or substantial equal resistive loading.

20 Claims, 9 Drawing Sheets

(56) References Cited

U.S. PATENT DOCUMENTS

| | | |
|---|---|---|
| 2006/0062061 A1* | 3/2006 | Suh .................... H01L 27/0688 |
| | | 365/189.11 |
| 2009/0207642 A1 | 8/2009 | Shimano et al. |
| 2017/0236568 A1 | 8/2017 | Rho |
| 2019/0198513 A1 | 6/2019 | Park et al. |
| 2021/0091108 A1 | 3/2021 | Naruke et al. |
| 2021/0232744 A1 | 7/2021 | Lin et al. |
| 2021/0375370 A1* | 12/2021 | Tsao ................... G11C 11/1673 |
| 2022/0028439 A1 | 1/2022 | Liu et al. |
| 2022/0139430 A1* | 5/2022 | Chang ..................... G11C 7/12 |
| | | 365/230.03 |
| 2023/0178122 A1* | 6/2023 | Jain ......................... G11C 5/14 |
| | | 365/226 |

* cited by examiner

MEMORY INCLUDING METAL RAILS WITH BALANCED LOADING

CROSS-REFERENCE TO RELATED PATENT APPLICATION

This application is a divisional of U.S. patent application Ser. No. 17/460,206, filed on Aug. 28, 2021, the entirety of which is hereby incorporated by reference.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
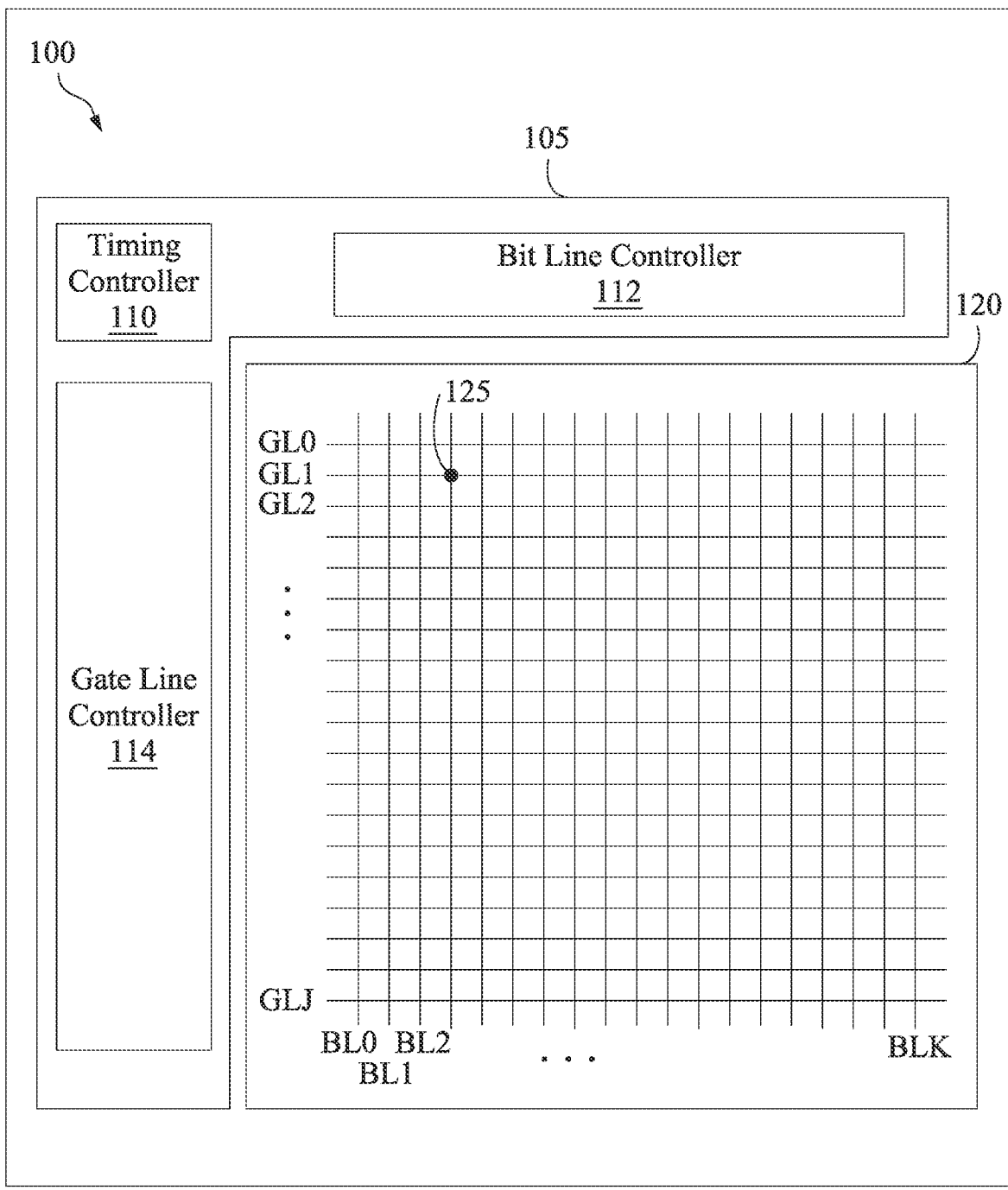
FIG. 1 is a diagram of a memory system, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory system includes metal rails with balanced resistive loadings. In one aspect, the memory system includes a set of resistive storage circuits connected between a first metal rail and a second metal rail in parallel. The first metal rail may be a first local line and the second metal rail may be a second local line. The first metal rail may be a first global line and the second metal rail may be a second global line. A local line may be a metal rail, to which a subset of resistive storage circuits can be connected, where a global line may be a metal rail, to which two or more local lines can be connected. A local line may be a local bit line or a local select line extending along a first direction, where a global line may be a global bit line or a global select line extending along a second direction.

Advantageously, a set of resistive storage circuits can have balanced resistive loading. For each resistive storage circuit of the set of resistive storage circuits, current may be injected at a common entry point of a first metal rail and exit through a common exit point of the second metal rail. In one aspect, a sum of i) a length of a first portion of the first metal rail from the common entry point to a first point, at which a first resistive storage circuit is connected, and ii) a length of a second portion of the second metal rail from the common exit point to a second point, at which the first resistive storage circuit is connected is equal to a sum of i) a length of a third portion of the first metal rail from the common entry point to a third point, at which a second resistive storage circuit is connected, and ii) a length of a fourth portion of the second metal rail from the common exit point to a fourth point, at which the second resistive storage circuit is connected. The first metal rail and the second metal rail may include same materials. Accordingly, the set of resistive storage circuits may have the same resistive loading of metal rails. By having the same or balanced resistive loading for the set of resistive storage circuits, data can be stored or read by the set of resistive storage circuits in a reliable manner.

FIG. 1 is a diagram of a memory system 100, in accordance with one embodiment. In some embodiments, the memory system 100 is implemented as an integrated circuit. In some embodiments, the memory system 100 includes a memory controller 105 and a memory array 120. The memory array 120 may include a plurality of storage circuits 125 (or memory cells 125) arranged in two- or three-dimensional arrays. Each storage circuit 125 may be connected to a corresponding gate line GL and a corresponding bit line BL. Each gate line GL may include any conductive material. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or storage circuits 125. In some embodiments, the memory array 120 includes gate lines GL0, GL1 . . . GLJ, each extending in a first direction and bit lines BL0, BL1 . . . BLK, each extending in a second direction. The gate lines GL and the bit lines BL may be conductive metals or conductive rails. Each gate line GL may include a word line and control lines. In one aspect, each storage circuit 125 is connected to a corresponding gate line GL and a corresponding bit line BL, and can be operated according to voltages or currents through the corresponding gate line GL and the corresponding bit line BL. In one aspect, each storage circuit 125 may be a non-volatile storage circuit. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120. In one aspect, the bit line controller 112 is a circuit that provides a voltage or current through one or more bit lines BL of the memory array 120 and senses a voltage or current from the memory array 120 through one or more bit lines BL or one or more select lines. In one configuration, the timing controller 110 is a circuit that provides control signals or clock signals to the gate line controller 114 and the bit line controller 112 to synchronize operations of the bit line controller 112 and the gate line controller 114. The bit line controller 112 may be connected to bit lines BL and select lines of the memory array 120, and the gate line controller 114 may be connected to gate lines GL of the memory array 120. In one example, to write data to a storage circuit 125, the gate line controller 114 applies a voltage or current to the storage circuit 125 through a gate line GL connected to the storage circuit 125, and the bit line controller 112 applies a voltage or current corresponding to data to be stored to the storage circuit 125 through a bit line BL connected to the storage circuit 125. In one example, to read data from a storage circuit 125, the gate line controller 114 applies a voltage or a current to the storage circuit 125 through a gate line GL connected to the storage circuit 125, and the bit line controller 112 senses a voltage or current corresponding to data stored by the storage circuit 125 through a select line or a bit line connected to the storage circuit 125. In some embodiments, the memory controller 105 includes more, fewer, or different components than shown in FIG. 1.

Figure 2:
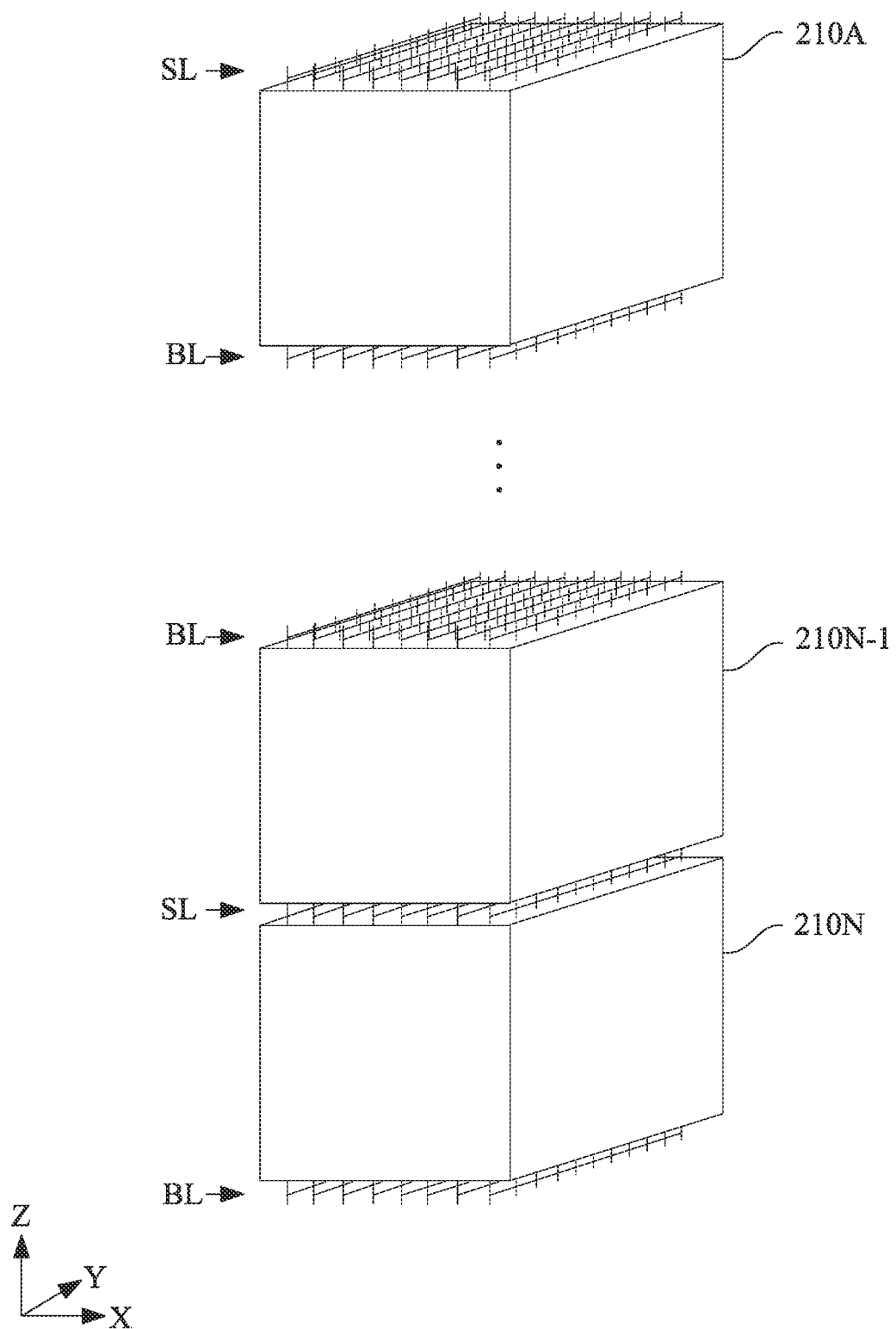
FIG. 2 is a diagram showing three-dimensional memory arrays, in accordance with one embodiment.

FIG. 2 is a diagram showing three-dimensional memory arrays 210A . . . 210N, in accordance with one embodiment. In some embodiments, the memory array 120 includes the memory arrays 210A . . . 210N. Each memory array 210 includes a plurality of storage circuits 125 arranged in a three-dimensional array. In some embodiments, each memory array 210 may include a same number of storage circuits 125. In some embodiments, two or more memory arrays 210 may include different numbers of storage circuits 125. In one configuration, the memory arrays 210A . . . 210N are stacked along a Z-direction. Each memory array 210 may have bit lines BL on one side of the memory array 210 and have select lines SL on an opposite side of the memory array 210. In some embodiments, two adjacent memory arrays 210 may share select lines SL. In some embodiments, two adjacent memory arrays 210 may share bit lines BL. For example, memory arrays 210N-1, 210N share or are electrically coupled to a set of select lines SL. For example, memory arrays 210N-2, 210N-1 share or are electrically coupled to a set of bit line BL. By sharing select lines SL and/or bit lines BL, a number of drivers of the memory controller 105 to apply signals through the select lines SL and/or bit lines BL can be reduced to achieve area efficiency. In some embodiments, the memory array 120 includes additional memory arrays that may have separate select lines SL and/or bit lines BL than shown in FIG. 2.

Figure 3:
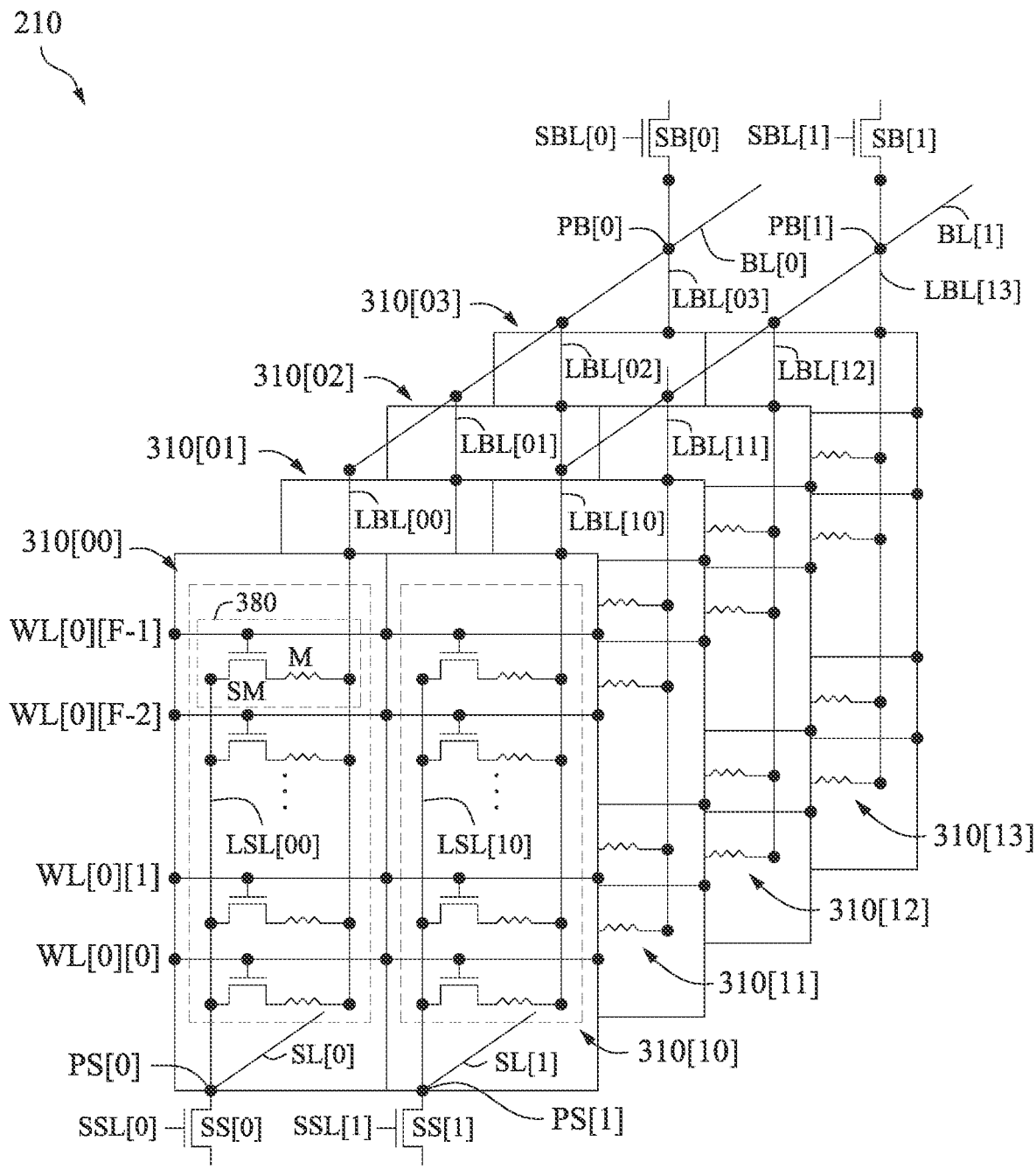
FIG. 3 is a diagram showing a portion of a three-dimensional memory array including metal rails with balanced resistive loading, in accordance with one embodiment.

FIG. 3 is a diagram showing a portion of a three-dimensional memory array 210 including metal rails with balanced resistive loading, in accordance with one embodiment. In FIG. 3, the memory array 210 includes a first set of resistive storage circuits and a second set of resistive storage circuits. In one configuration, the first set of resistive storage circuits includes subsets 310[00] . . . 310[03] of storage circuits that may be electrically coupled to a global bit line BL[0] and a global select line SL[0] extending along a Y-direction. In one configuration, the second set of resistive storage circuits includes subsets 310[10] . . . 310[13] of resistive storage circuits that may be electrically coupled to a global bit line BL[1] and a global select line SL[1] extending along the Y-direction. Each subset 310 of resistive storage circuits may include F number of resistive storage circuits 380 (e.g., storage circuit 125) disposed along a Z-direction. Each set of resistive storage circuits may include a larger number of subsets 310 of resistive storage circuits than shown in FIG. 3 along the Y-direction. The memory array 210 may include a larger number of sets of resistive storage circuits than shown in FIG. 3 stacked along the X-direction. By arranging storage circuits 380 as shown in FIG. 3, a storage density of the memory array 210 can be increased.

In one configuration, each subset 310 of resistive storage circuits includes F number of resistive storage circuits 380 disposed along the Z-direction. Each resistive storage circuit 380 may include a switch SM and one or more resistive cells M coupled between a local select line LSL and a local bit line LBL. Each switch SM may be embodied as a transistor (e.g., MOSFET, GAAFET, FinFET, etc.). Each switch SM may be an N-type transistor or a P-type transistor. Each resistive cell M may be embodied as a resistive random access memory component, a phase change random access memory component, a magnetoresistive random-access memory component, or any resistive storage component. Each switch SM may include a first electrode (e.g., source electrode) coupled to a local select line LSL, a second electrode (e.g., drain electrode) coupled to a first electrode of the resistive cell M, and a third electrode (e.g., gate electrode) coupled to a corresponding word line WL[X][Z]. A word line WL[X][Z] may extend along the X-direction to connect gate electrodes of corresponding switches SM in different sets to the memory controller (e.g., gate line controller 114). In one aspect, the switch SM is enabled, in response to a high voltage (e.g., logic '1') applied to the word line WL[X][Z] to electrically couple the local select line LSL to the resistive cell M. In one aspect, the switch SM is disabled, in response to a low voltage (e.g., logic '0') applied to the word line WL[X][Z] to electrically decouple the local select line LSL from the resistive cell M. Each resistive cell M may have a resistance corresponding to programmed data, according to a voltage applied across the resistive cell M or current applied through the resistive cell M.

In one configuration, a subset 310 of resistive storage circuits 380 is connected in parallel between a local select line LSL and a local bit line LBL. A local select line LSL may be a metal rail, at which first ports of a subset 310 of resistive storage circuits (e.g., first electrodes of the switches SM) are connected. A local bit line LBL may be a metal rail, at which second ports of the subset 310 of resistive storage circuits (e.g., second electrodes of the resistive cells M) are connected. The local select line LSL may extend along the Z-direction and connect to a corresponding point of a global select line SL extending along the Y-direction. Similarly, the local bit line LBL may extend along the Z-direction and connect to a corresponding point of a global bit line BL extending along the Y-direction.

In some embodiments, the global bit line BL[X] is connected to a corresponding switch SB[X]. Through the global bit line BL[X] and the switch SB[X], local bit lines LBL[X0] ... LBL[X3] can be electrically coupled to the memory controller 105 (e.g., bit line controller 112). Each switch SB[X] may be embodied as a transistor (e.g., MOSFET, GAAFET, FinFET, etc.). Each switch SB [X] may be an N-type transistor or a P-type transistor. Each switch SB[X] may include a first electrode (e.g., source electrode) connected to the global bit line BL[X], a second electrode (e.g., drain electrode) connected to the memory controller 105 (e.g., bit line controller 112) through a metal rail, and a third electrode (e.g., gate electrode) connected to a corresponding switch control line SBL. The switch control line SBL may be a metal rail extending along the X-direction to connect the memory controller 105 (e.g., gate line controller 114) to the gate electrodes of switches SB. According to a voltage or a signal applied through the switch control line SBL, one or more switches SB connected to the switch control line SBL may be enabled or disabled. For example, in response to a voltage corresponding to logic state '1' provided through the switch control line SBL[X], a switch SB[X] may be enabled to electrically couple the memory controller 105 (e.g., bit line controller 112) to the global bit line BL[X]. For example, in response to a voltage corresponding to logic state '0' provided through the switch control line SBL[X], the switch SB[X] may be disabled to electrically decouple the memory controller 105 (e.g., bit line controller 112) from the global bit line BL[X].

In some embodiments, the global select line SL[X] is connected to a corresponding switch SS[X]. Through the global select line SL[X] and the switch SS[X], local select lines LSL[X0] ... LSL[X3] can be electrically coupled to the memory controller 105 (e.g., bit line controller 112). Each switch SS may be embodied as a transistor (e.g., MOSFET, GAAFET, FinFET, etc.). Each switch SS[X] may be an N-type transistor or a P-type transistor. Each switch SS[X] may include a first electrode (e.g., drain electrode) connected to the global select line SL[X], a second electrode (e.g., source electrode) connected to the memory controller 105 (e.g., bit line controller 112) through a metal rail, and a third electrode (e.g., gate electrode) connected to a corresponding switch control line SSL. The switch control line SSL may be a metal rail extending along the X-direction to connect the memory controller 105 (e.g., gate line controller 114) to the gate electrodes of switches SS. According to a voltage or a signal applied through the switch control line SSL, one or more switches SS connected to the switch control line SSL may be enabled or disabled. For example, in response to a voltage corresponding to logic state '1' provided through the switch control line SSL[X], a switch SS[X] may be enabled to electrically couple the memory controller 105 (e.g., bit line controller 112) to the global select line SL[X]. For example, in response to a voltage corresponding to logic state '0' provided through the switch control line SSL[X], the switch SS[X] may be disabled to electrically decouple the memory controller 105 (e.g., bit line controller 112) from the global select line SL[X].

In one configuration, the switches SB, SS can be operated or configured according to a voltage or signal from the memory controller 105 (e.g., gate line controller 114) to electrically couple the set of resistive storage circuits to corresponding global lines BL, SL selectively. For example, during a first time period, the switches SB[0], SS[0] can be simultaneously enabled while the switches SB[1], SS[1] are disabled to operate or configure the set of memory cells 310[00] ... 310[03]. For example, during a second time period, the switches SB[1], SS[1] can be simultaneously enabled while the switches SB[0], SS[0] are disabled to operate or configure the set of memory cells 310[10] ... 310[13].

In some embodiments, the memory array 210 includes either one of the switches SB, SS, but may lack the other of the switches SB, SS. For example, the memory array 210 includes the switches SB as shown in FIG. 3, where the switches SS are omitted and global select lines SL[0], SL[1] are connected to the memory controller 105 (e.g., bit line controller 112) through metal rails. For example, the memory array 210 includes the switches SS as shown in FIG. 3, where the switches SB are omitted and global bit lines BL[0], BL[1] are connected to the memory controller 105 (e.g., bit line controller 112) through metal rails. The switches SS or SB can be configured or operated to electrically couple or decouple the corresponding set of resistive storage circuits to a corresponding global line selectively.

In one aspect, the set 310[00] ... 310[13] of resistive storage circuits has same or substantially equivalent resistive loading of metal rails. In one aspect, the switch SB[X] is connected to a common entry point PB[X] of the global bit line BL[X]. In one aspect, the switch SS[X] is connected to a common exit point PS[X] of the global select line SL[X]. Local bit lines LBL may be connected to corresponding points of the global bit lines BL, and local select lines LSL may be connected to corresponding points of the global select lines SL. For each subset 310 of resistive storage circuits, current may be injected at the common entry point PB[X] of the global bit line BL[X] and exit through the common exit point PS[X] of the global select line SL[X]. In one aspect, a sum of i) a length of a first portion of the global bit line BL[X] from the common entry point PB[X] to a first point, at which the first subset 310[XY] of resistive storage circuits is connected, and ii) a length of a second portion of the global select line SL[X] from the common exit point PS[X] to a second point, at which the first subset 310[XY] of resistive storage circuits is connected is equal to a sum of i) a length of a third portion of the global bit line BL[X] from the common entry point PB[X] to a third point, at which the second subset 310[XY+1] of resistive storage circuits is connected, and ii) a length of a fourth portion of the global select line SL[X] from the common exit point PS[X] to a fourth point, at which the second subset 310[XY+1] of resistive storage circuits is connected. The global bit line BL and the global select line SL may include same materials. Accordingly, the subsets 310[X0] . . . 310[X3] of resistive storage circuits may have the same resistive loading of metal rails. By having the same or balanced resistive loading of the global bit line BL and the global select line SL, data can be stored or read by the set of resistive storage circuits in a reliable manner.

Figure 4A:
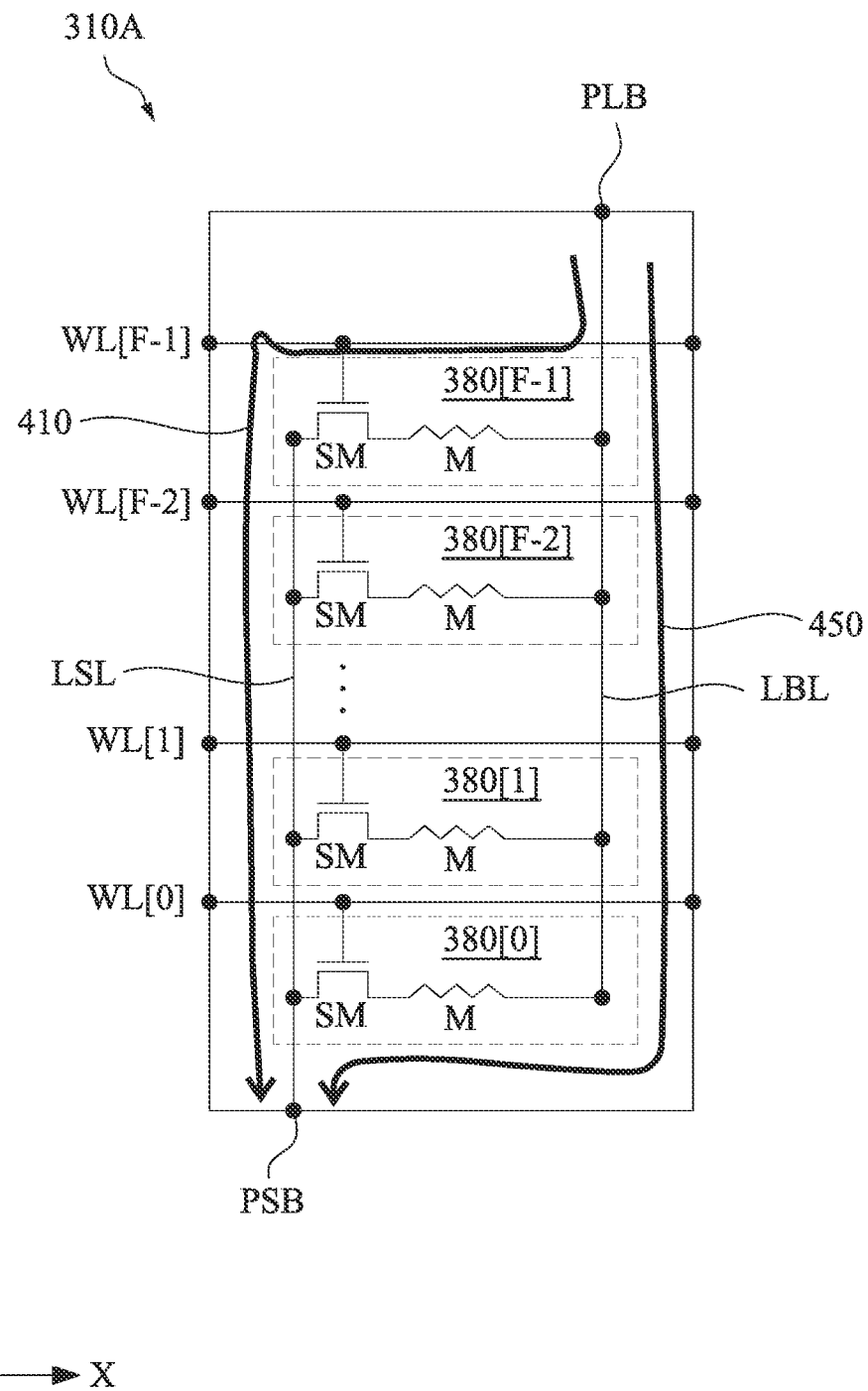
FIG. 4A is a diagram showing a subset of resistive storage circuits including local lines with balanced resistive loading, in accordance with one embodiment.

FIG. 4A is a diagram showing a subset 310A of resistive storage circuits including a local bit line LBL and a local select line LSL with balanced resistive loading, in accordance with one embodiment. In one aspect, the subset 310A of resistive storage circuits has same or substantially equivalent resistive loading of metal rails. The subset 310A of storage circuits may be connected between the local select line LSL and the local bit line LBL in parallel. Each resistive storage circuit may be connected to a corresponding point of the local bit line LBL, and a corresponding point of the local select line LSL.

For each resistive storage circuit of the subset 310A of storage circuits, current may be injected at the common entry point PLB of the local bit line LBL and exit through the common exit point PSB of the local select line LSL. For example, current may flow through the common entry point PLB, the first resistive storage circuit 380[0], and the common exit point PSB along a path 450. For example, current may flow through the common entry point PLB, the second resistive storage circuit 380[F-1], and the common exit point PSB along a path 410. The memory controller may sense current through the path 450 during a first time period to determine data stored by the resistive storage circuit 380[0], and sense current through the path 410 during a second time period to determine data stored by the resistive storage circuit 380[F-1]. In one aspect, a sum of i) a length of a first portion of the local bit line LBL from the common entry point PLB to a first point, at which the first resistive storage circuit 380[0] is connected, and ii) a length of a second portion of the local select line LSL from the common exit point PSB to a second point, at which the first resistive storage circuit 380[0] is connected is equal to a sum of i) a length of a third portion of the local bit line LBL from the common entry point PLB to a third point, at which the second resistive storage circuit 380[F-1] is connected, and ii) a length of a fourth portion of the local select line LSL from the common exit point PSB to a fourth point, at which the second resistive storage circuit 380[F-1] is connected. The local bit line LBL and the local select line LSL may include same materials. Accordingly, the subset 310A of resistive storage circuits may have the same resistive loading of metal rails. By having the same or balanced resistive loading of the local bit line LBL and the local select line LSL, data can be stored or read by the subset 310A of resistive storage circuits in a reliable manner.

Figure 4B:
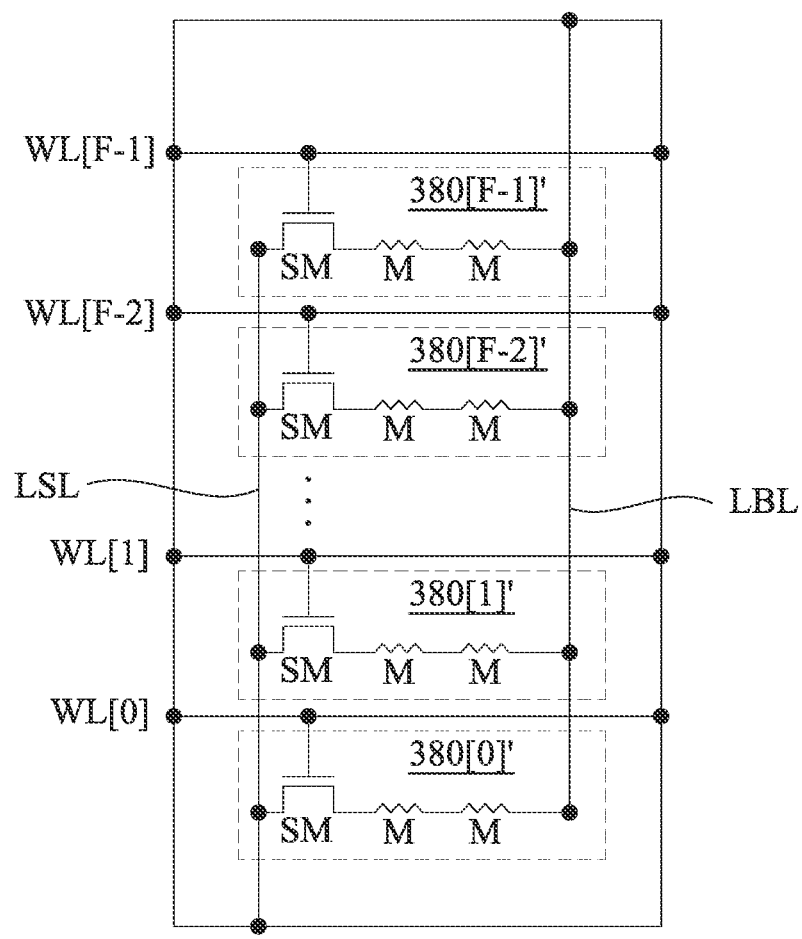
FIG. 4B is a diagram showing a subset of resistive storage circuits including local lines with balanced resistive loading, in accordance with one embodiment.

FIG. 4B is a diagram showing a subset 310B of resistive storage circuits including a local bit line LBL and a local select line LSL with balanced resistive loading, in accordance with one embodiment. The subset 310B of resistive storage circuits is similar to the subset 310A of resistive storage circuits in FIG. 4A, except the subset 310B of resistive storage circuits includes resistive storage circuits 380[0]' . . . 380[F-1]' each having two or more resistive cells M. The two or more resistive cells M may be connected in series between the local bit line LBL and the local select line LSL. By implementing the two or more resistive cells M for each resistive storage circuit 380', multi-level data can be stored by each resistive storage circuit 380' to increase storage density.

Figures 5A, 5B, 5C:
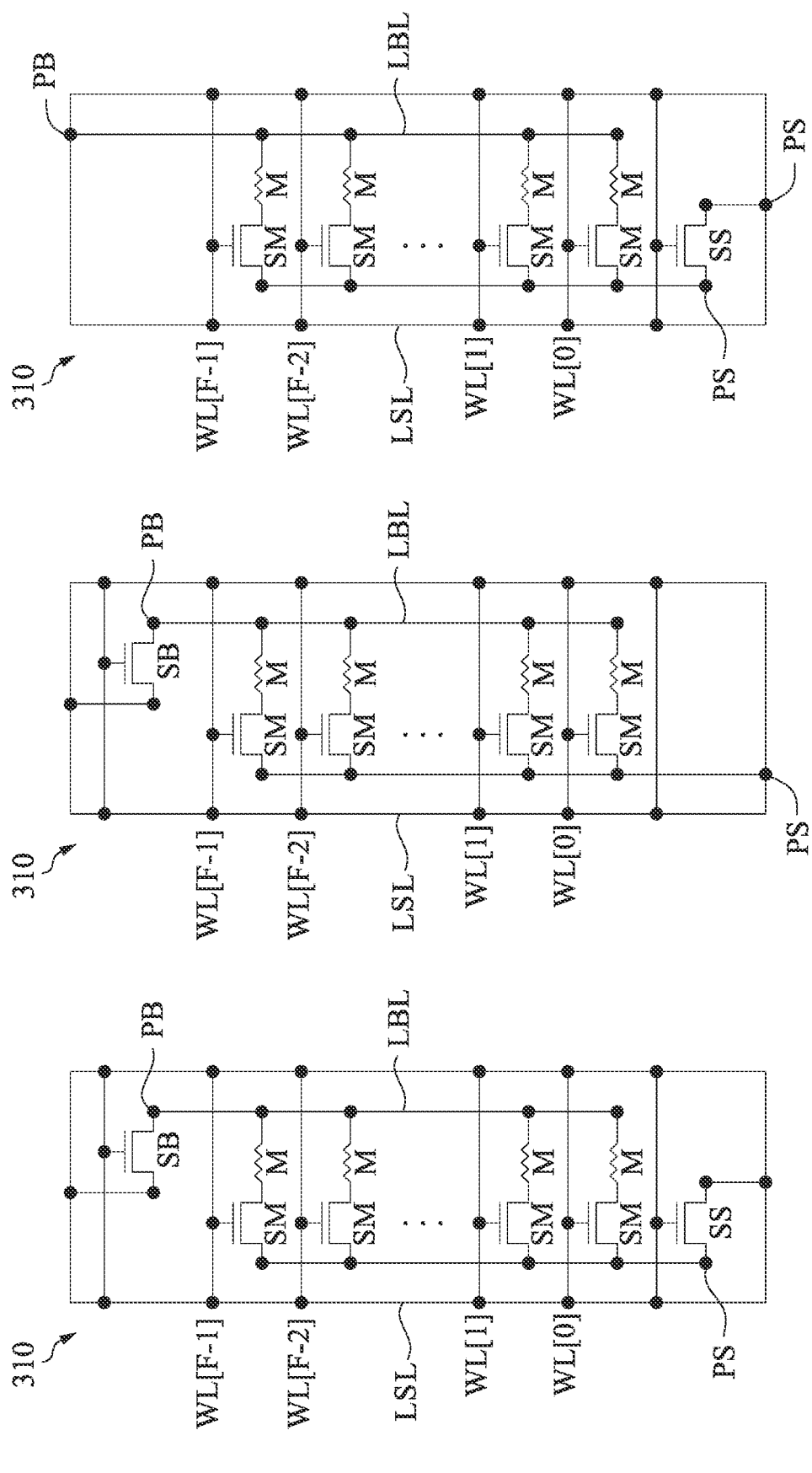
FIG. 5A is a diagram showing a first switch connected to a local bit line and a second switch connected to a local select line of a subset of resistive storage circuits, in accordance with one embodiment.
FIG. 5B is a diagram showing a switch connected to a local bit line of a subset of resistive storage circuits, in accordance with one embodiment.
FIG. 5C is a diagram showing a switch connected to a local select line of a subset of resistive storage circuits, in accordance with one embodiment.

FIG. 5A is a diagram showing a first switch SB connected to a local bit line LBL and a second switch SS connected to a local select line LSL of a subset 310 of storage circuits, in accordance with one embodiment. As described above with respect to FIG. 3, a memory controller 105 (e.g., bit line controller 112) may be electrically coupled to the subset 310 of resistive storage circuits through the switches SB, SS. The switch SB may be embodied as an N-type transistor or a P-type transistor, and the switch SS may be embodied as an N-type transistor or a P-type transistor. The memory controller 105 (e.g., gate line controller 114) may simultaneously enable or disable the switches SS, SB to configure or operate one or more resistive storage circuits 380 of the subset 310 of resistive storage circuits.

In some embodiments, the subset 310 of resistive storage circuits is connected to one of the switches SB, SS, while the other of the switches SB, SS is omitted. For example in FIG. 5B, the switch SB is connected to the local bit line LBL without the switch SS. For example in FIG. 5C, the switch SS is connected to the local select line LSL without the switch SB. In one aspect, each switch may have a parasitic resistance, which may result in reduced operating speed or increased power consumption. By omitting one of the switches SB, SS as shown in FIG. 5B or FIG. 5C, parasitic resistance can be reduced to improve operating speed or improve power efficiency.

Figure 6:
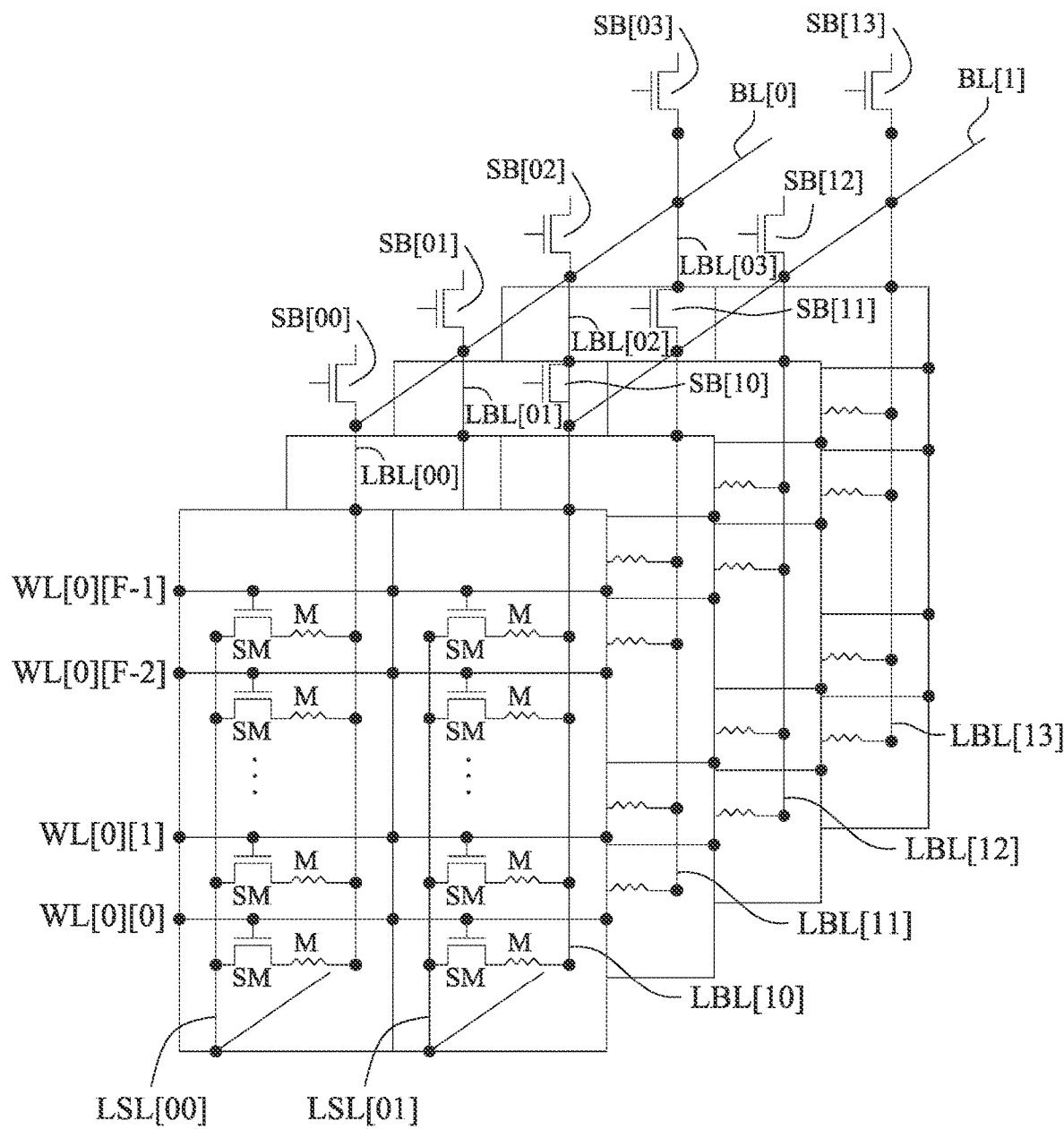
FIG. 6 is a diagram showing a portion of a three-dimensional memory array including multiple switches connected to global lines, in accordance with one embodiment.

FIG. 6 is a diagram showing a portion of a three-dimensional array including multiple switches SB[00] . . . SB[03], SB[10] . . . SB[13] connected to global bit lines BL[0], BL[1], in accordance with one embodiment. In one aspect, the memory array 210' is similar to the memory array 210 in FIG. 3, except the memory array 210' includes switches SB[00] . . . SB[03] connected to the global bit line BL[0] and switches SB[10] . . . SB[13] connected to the global bit line BL[1] without the switches SS[0], SS[1]. Thus, detailed description of duplicated portion thereof is omitted herein for the sake of brevity. In some embodiments, the memory array 210' includes switches SB[00] . . . SB[03] connected to the global select line SL[0] and switches SB[10] . . . SB[13] connected to the global select line SL[1]. The switches SB[00] . . . SB[03] may be simultaneously enabled or disabled, according to a signal or pulse from the memory controller 105 (e.g., gate line controller 114). Similarly, the switches SB[10] . . . SB[13] may be simultaneously enabled or disabled, according to a signal or pulse from the memory controller 105 (e.g., gate line controller 114). In one approach, during a first time period, the switches SB[00] . . . SB[03] are enabled, and the switches SB[10] . . . SB[13] are disabled. In one approach, during a second time period, the switches SB[10] . . . SB[13] are enabled, and the switches SB[00] . . . SB[03] are disabled. In one aspect, the switches may be connected to a global line in a parallel configuration, such that parasitic resistances due to the switches can be reduced due to the parallel configuration. Moreover, resistive loading at the global line can be distributed at different points of the global line to allow more reliable operation of the set of resistive storage circuits.

Figure 7:
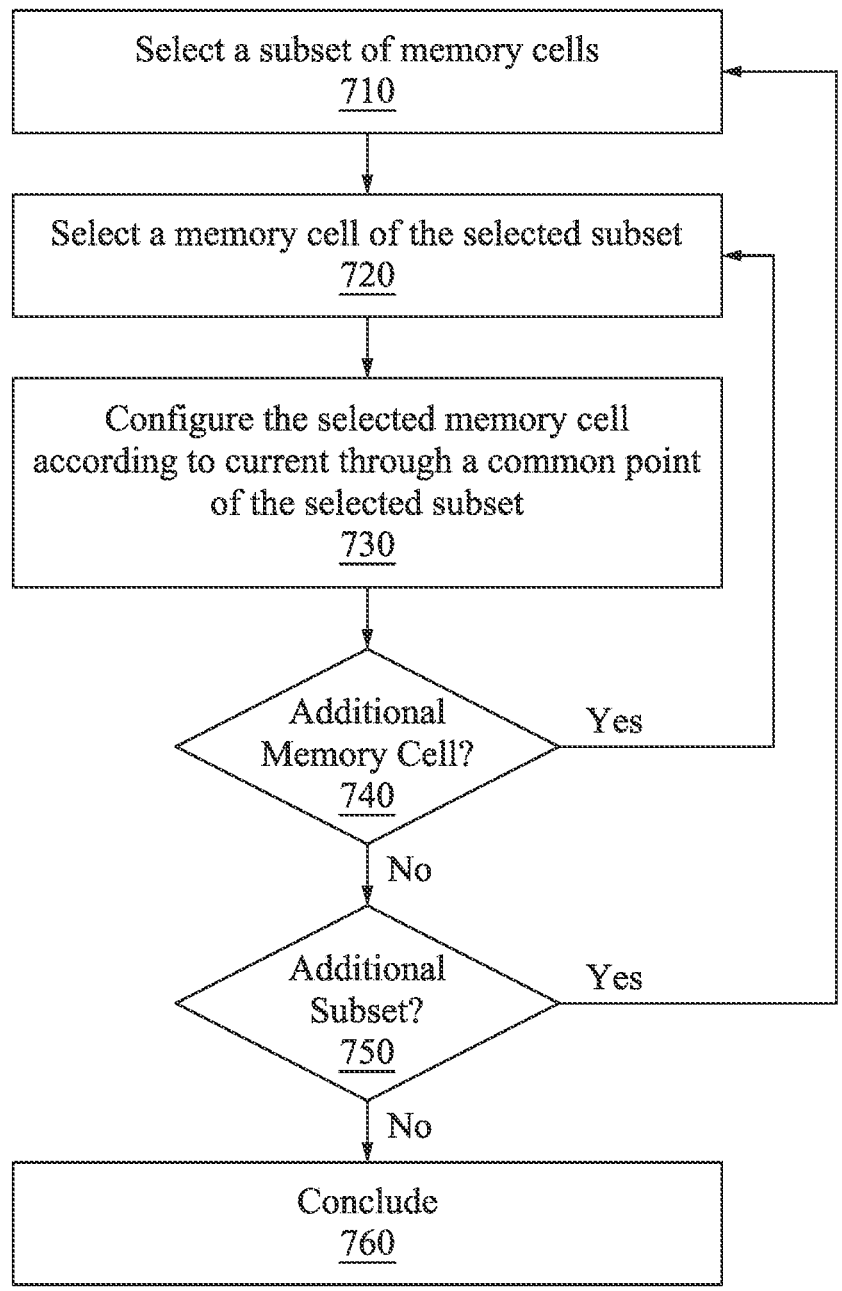
FIG. 7 is a flowchart showing a method of operating a set of resistive storage circuits, in accordance with some embodiments.

FIG. 7 is a flowchart showing a method 700 of configuring or operating a set of storage circuits (e.g., storage circuit 125), in accordance with some embodiments. The method 700 may be performed by the memory controller 105 of FIG. 1. In some embodiments, the method 700 is performed by other entities. In some embodiments, the method 700 includes more, fewer, or different operations than shown in FIG. 7.

In an operation 710, the memory controller 105 selects a subset 310 of memory cells from a set of memory cells. Each memory cell may be a resistive storage circuit. Each resistive storage circuit may include one or more resistive cells. Each resistive cell may be embodied as a resistive random access memory component, a phase change random access memory component, a magnetoresistive random-access memory component, or any resistive storage component. In one aspect, the subset of memory cells are connected between a local bit line LBL and a local select line LSL in parallel. The local bit line LBL may extend along a first direction (e.g., Z-direction), and the local select line LSL may extend along the first direction (e.g., Z-direction).

In an operation 720, the memory controller 105 selects a memory cell of the selected subset. In an operation 730, the memory controller 105 configures the selected memory cell according to current through a common point of the selected subset. In one approach, to write data at the selected memory cell, the memory controller 105 may apply a write voltage to a word line connected to the selected memory cell, and apply another write voltage to a global bit line BL and a local bit line LBL electrically coupled to the selected memory cell. The memory controller 105 may apply a ground voltage to the global select line SL and the local select line LSL electrically coupled to the selected memory cell. In one approach, to read data stored by the selected memory cell, the memory controller 105 may apply a read voltage to the word line connected to the selected memory cell, and apply another read voltage to the global bit line BL and the local bit line LBL electrically coupled to the selected memory cell. The memory controller 105 may apply a ground voltage to the global select line SL and the local select line LSL electrically coupled to the selected memory cell. In response to the read voltage applied, the memory controller 105 may sense current through the selected memory cell, for example, through the global bit line LBL and the local bit line BL. According to the sensed current, the memory controller 105 may determine data stored by the selected memory cell according to the sensed current.

In one approach, current is injected through a common entry point of the local bit line LBL and exits through a common exit point of the local select line SL. Each storage circuit may be connected to a corresponding point of the local bit line LBL, and a corresponding point of the local select line LSL. For a memory cell of the subset 310 of memory cells, current may be injected at the common entry point PLB of the local bit line LBL and exit through the common exit point PSB of the local select line LSL. For example, current may flow through the common entry point PLB, the first resistive storage circuit 380[0], and the common exit point PSB along a path 450. For example, current may flow through the common entry point PLB, the second resistive storage circuit 380[F-1], and the common exit point PSB along a path 410. In one aspect, a sum of i) a length of a first portion of the local bit line LBL from the common entry point PLB to a first point, at which the first resistive storage circuit 380[0] is connected, and ii) a length of a second portion of the local select line LSL from the common exit point PSB to a second point, at which the first resistive storage circuit 380[0] is connected is equal to a sum of i) a length of a third portion of the local bit line LBL from the common entry point PLB to a third point, at which the second resistive storage circuit 380[F-1] is connected, and ii) a length of a fourth portion of the local select line LSL from the common exit point PSB to a fourth point, at which the second resistive storage circuit 380[F-1] is connected. The local bit line LBL and the local select line LSL may include same materials. Accordingly, the subset 310 of memory cell may have the same resistive loading. By ensuring that current injected to the common entry point PLB exits through the common exit point PSB for any memory cell of the subset of memory cells, the subset of memory cells may have the same or balanced resistive loading of metal rails. The balanced resistive loading allows the subset of memory cells to operate or be configured in a reliable manner.

In an operation 740, the memory controller 105 determines whether an additional memory cell in the selected subset to configure exists. The additional memory cell may be disposed above the selected memory cell along the Z-direction. If the additional memory cell in the selected subset exists, the memory controller 105 may proceed to the operation 720 and select a subsequent memory cell of the subset of memory cells. If no additional memory cell in the selected subset exists, the memory controller 105 may proceed to an operation 750.

In the operation 750, the memory controller 105 determines whether an additional subset of memory cells to configure exists or not. An additional subset of memory cells may be disposed above the subset of memory cells along the Y-direction. If additional subset exists, the memory controller 105 may proceed to the operation 710 and select a subsequent subset of memory cells. In some embodiments, the memory controller 105 may select another set of memory cells, and may proceed to the operation 710 for the another set of memory cells. The another set of memory cells may be stacked or disposed above the set of memory cells along the X-direction. If no additional set of memory cells exists, the memory controller 105 may conclude in an operation 760.

Figure 8:
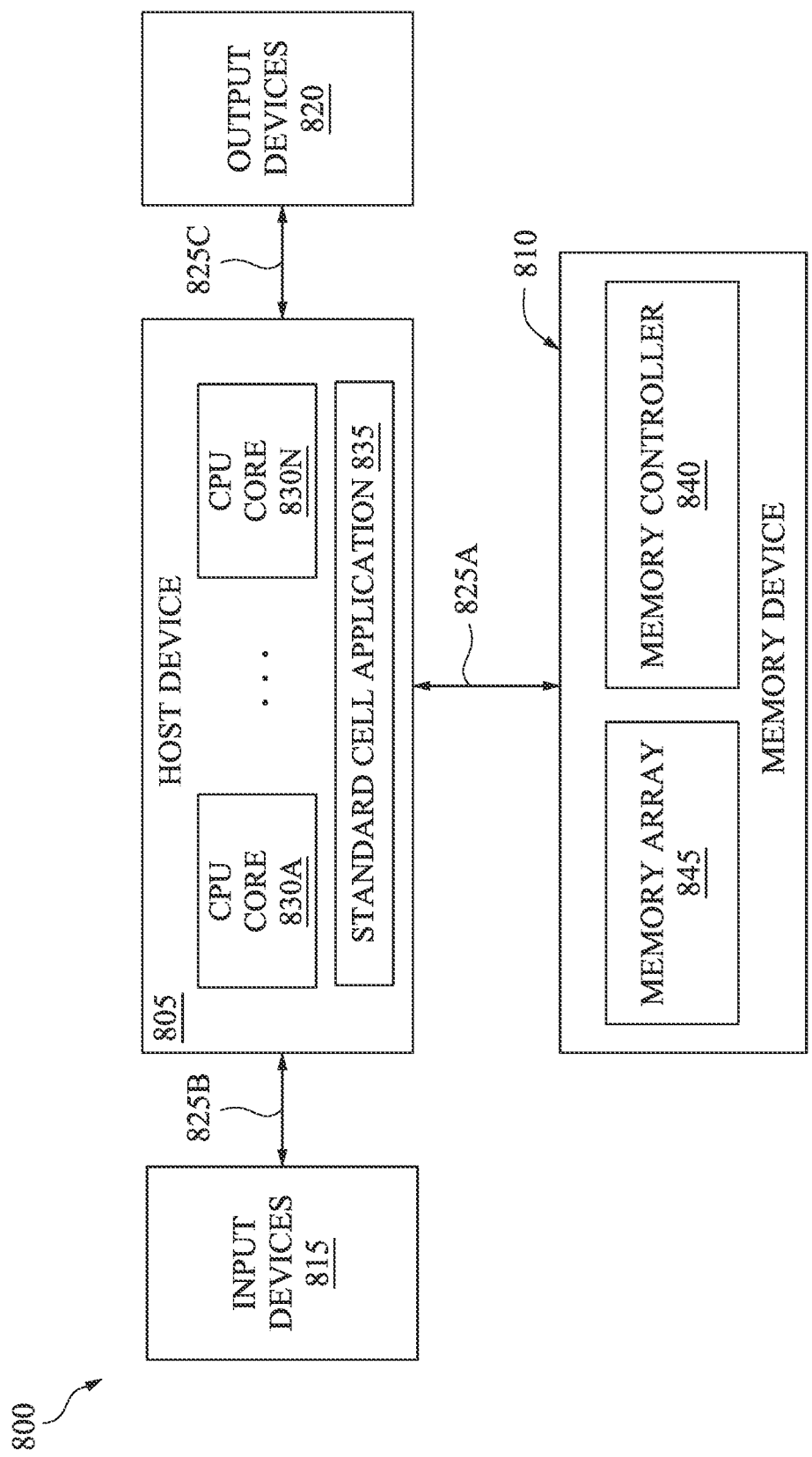
FIG. 8 is an example block diagram of a computing system, in accordance with some embodiments.

Referring now to FIG. 8, an example block diagram of a computing system 800 is shown, in accordance with some embodiments of the disclosure. The computing system 800 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 800 includes a host device 805 associated with a memory device 810. The host device 805 may be configured to receive input from one or more input devices 815 and provide output to one or more output devices 820. The host device 805 may be configured to communicate with the memory device 810, the input devices 815, and the output devices 820 via appropriate interfaces 825A, 825B, and 825C, respectively. The computing system 800 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 805.

The input devices 815 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 805 and that allows an external source, such as a user (e.g., a circuit or layout designer), to enter information (e.g., data) into the host device and send instructions to the host device. Similarly, the output devices 820 may include a variety of output technologies such as external memories, printers, speakers, displays, microphones, light emitting diodes, headphones, video devices, and any other output peripherals that are configured to receive information (e.g., data) from the host device 805. The "data" that is either input into the host device 805 and/or output from the host device may include any of a variety of textual data, circuit data, signal data, semiconductor device data, graphical data, combinations thereof, or other types of analog and/or digital data that is suitable for processing using the computing system 800.

The host device 805 includes or is associated with one or more processing units/processors, such as Central Processing Unit ("CPU") cores 830A-830N. The CPU cores 830A-830N may be implemented as an Application Specific Integrated Circuit ("ASIC"), Field Programmable Gate Array ("FPGA"), or any other type of processing unit. Each of the CPU cores 830A-830N may be configured to execute instructions for running one or more applications of the host device 805. In some embodiments, the instructions and data to run the one or more applications may be stored within the memory device 810. The host device 805 may also be configured to store the results of running the one or more applications within the memory device 810. Thus, the host device 805 may be configured to request the memory device 810 to perform a variety of operations. For example, the host device 805 may request the memory device 810 to read data, write data, update or delete data, and/or perform management or other operations. One such application that the host device 805 may be configured to run may be a standard cell application 835. The standard cell application 835 may be part of a computer aided design or electronic design automation software suite that may be used by a user of the host device 805 to use, create, or modify a standard cell of a circuit. In some embodiments, the instructions to execute or run the standard cell application 835 may be stored within the memory device 810. The standard cell application 835 may be executed by one or more of the CPU cores 830A-830N using the instructions associated with the standard cell application from the memory device 810. In one example, the standard cell application 835 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 8, the memory device 810 includes a memory controller 840 that is configured to read data from or write data to a memory array 845. The memory array 845 may include a variety of volatile and/or non-volatile memories. For example, in some embodiments, the memory array 845 may include NAND flash memory cores. In other embodiments, the memory array 845 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 845 may be individually and independently controlled by the memory controller 840. In other words, the memory controller 840 may be configured to communicate with each memory within the memory array 845 individually and independently. By communicating with the memory array 845, the memory controller 840 may be configured to read data from or write data to the memory array in response to instructions received from the host device 805. Although shown as being part of the memory device 810, in some embodiments, the memory controller 840 may be part of the host device 805 or part of another component of the computing system 800 and associated with the memory device. The memory controller 840 may be implemented as a logic circuit in either software, hardware, firmware, or combination thereof to perform the functions described herein. For example, in some embodiments, the memory controller 840 may be configured to retrieve the instructions associated with the standard cell application 835 stored in the memory array 845 of the memory device 810 upon receiving a request from the host device 805.

It is to be understood that only some components of the computing system 800 are shown and described in FIG. 8. However, the computing system 800 may include other components such as various batteries and power sources, networking interfaces, routers, switches, external memory systems, controllers, etc. Generally speaking, the computing system 800 may include any of a variety of hardware, software, and/or firmware components that are needed or considered desirable in performing the functions described herein. Similarly, the host device 805, the input devices 815, the output devices 820, and the memory device 810 including the memory controller 840 and the memory array 845 may include other hardware, software, and/or firmware components that are considered necessary or desirable in performing the functions described herein.

One aspect of this description relates to a memory array. In some embodiments, the memory array includes a set of resistive storage circuits including a first subset of resistive storage circuits and a second subset of resistive storage circuits. In some embodiments, the first subset of resistive storage circuits is connected between a first local line and a second local line in parallel. In some embodiments, the first local line and the second local line extend along a first direction. In some embodiments, the second subset of resistive storage circuits is connected between a third local line and a fourth local line in parallel. In some embodiments, the third local line and the fourth local line extend along the first direction. In some embodiments, the first local line and the third local line are electrically coupled to a first global line extending along a second direction.

One aspect of this description relates to a memory system. In some embodiments, the memory system includes a memory array and a controller. In some embodiments, the memory array includes a set of resistive storage circuits including a first subset of resistive storage circuits connected between a first local line and a second local line in parallel. In some embodiments, the first local line and the second local line extend along a first direction. In some embodiments, the controller is coupled to the memory array. In some embodiments, the memory controller is configured to apply, for each resistive storage circuit of the first subset of resistive storage circuits, a voltage to the first local line. In some embodiments, the memory controller is configured to sense, for the each resistive storage circuit of the first subset of resistive storage circuits, current, in response to the voltage to read data stored by each resistive storage circuit of the first subset of resistive storage circuits. In some embodiments, for the each resistive storage circuit of the first subset of resistive storage circuits, the current injected at a first common entry point of the first local line exits through a first common exit point of the second local line.

One aspect of this description relates to a method of operating a memory system. In some embodiments, the method includes applying, by a controller during a first time period, a voltage to a first common entry point of a first metal rail. In some embodiments, a first set of resistive storage circuits is connected between the first metal rail and a second metal rail in parallel. In some embodiments, the method includes sensing, by the controller through a first common exit point of the second metal rail during the first time period, a first current from a first resistive storage circuit of the first set of resistive storage circuits, in response to the voltage. In some embodiments, the method includes determining, by the controller during the first time period, first data stored by the first resistive storage circuit of the first set of resistive storage circuits according to the first current. In some embodiments, the method includes applying, by the controller during a second time period, the voltage to the first common entry point of the first metal rail. In some embodiments, the method includes sensing, by the controller during the second time period through the first common exit point of the second metal rail, a second current from a second resistive storage circuit of the first set of resistive storage circuits, in response to the voltage. In some embodiments, the method includes determining, by the controller during the second time period, second data stored by the second resistive storage circuit of the first set of resistive storage circuits according to the second current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    applying, by a controller during a first time period, a voltage to a first common entry point of a first metal rail, wherein a first set of resistive storage circuits is connected between the first metal rail and a second metal rail in parallel;
    sensing, by the controller through a first common exit point of the second metal rail during the first time period, a first current from a first resistive storage circuit of the first set of resistive storage circuits, in response to the voltage;
    determining, by the controller during the first time period, first data stored by the first resistive storage circuit of the first set of resistive storage circuits according to the first current;
    applying, by the controller during a second time period, the voltage to the first common entry point of the first metal rail;
    sensing, by the controller during the second time period through the first common exit point of the second metal rail, a second current from a second resistive storage circuit of the first set of resistive storage circuits, in response to the voltage; and
    determining, by the controller during the second time period, second data stored by the second resistive storage circuit of the first set of resistive storage circuits according to the second current.

2. The method of claim 1, further comprising:
    applying, by the controller during a third time period, the voltage to a second common entry point of a third metal rail, wherein a second set of resistive storage circuits is connected between the third metal rail and a fourth metal rail in parallel, wherein the first metal rail and the third metal rail are connected to a first global line, wherein the second metal rail and the fourth metal rail are connected to a second global line;
    sensing, by the controller during the third time period through a second common exit point of the fourth metal rail, a third current from a third resistive storage circuit of the second set of resistive storage circuits, in response to the voltage;
    determining, by the controller during the third time period, third data stored by the third resistive storage circuit of the second set of resistive storage circuits according to the third current;
    applying, by the controller during a fourth time period, the voltage to the second common entry point of the third metal rail;
    sensing, by the controller during the fourth time period through the second common exit point of the fourth metal rail, a fourth current through a fourth resistive storage circuit of the second set of resistive storage circuits, in response to the voltage; and
    determining, by the controller during the fourth time period, fourth data stored by the fourth resistive storage circuit of the second set of resistive storage circuits according to the fourth current.

3. The method of claim 1, wherein the first metal rail and the second metal rail comprise same materials.

4. The method of claim 1, wherein the first set of resistive storage circuits extend a same distance between the first metal rail and the second metal rail.

5. The method of claim 1, further comprising:
    applying, by the controller during a third time period, a second voltage across the first resistive storage circuit; and thereafter
    sensing, by the controller through the first common exit point of the second metal rail subsequent to the third time period, a third current from the first resistive storage circuit, the third current greater than the first current.

6. The method of claim 1, wherein determining the first data stored by the first resistive storage circuit comprises:
    determining a plurality of bit values, the plurality of bit values corresponding to a plurality of resistive cells of the first resistive storage circuit.

7. The method of claim 6, further comprising:
    applying, by the controller during a third time period, a second voltage across one resistive cell of the plurality of resistive cells; and thereafter
    sensing, by the controller through the first common exit point of the second metal rail subsequent to the third time period, a third current from the first resistive storage circuit, the third current greater than the first current; and
    determining a second plurality of bit values corresponding to the plurality of resistive cells of the first resistive storage circuit.

8. The method of claim 1, wherein the each of the first set of resistive storage circuits comprises:
    a first electrode of a switch coupled to a resistive cell;

a second electrode of the switch coupled to the first metal rail; and a gate electrode of the switch connected to a third metal rail.

9. The method of claim 8, wherein the switch comprises a P-type transistor.

10. The method of claim 8, wherein the switch comprises an N-type transistor.

11. A memory controller configured to:
apply, during a first time period, a voltage to a first resistive storage circuit of a first set of resistive storage circuits via a first common entry point of a first metal rail coupled to a first end of the first set of resistive storage circuits;
sense, during the first time period, a first current from the first resistive storage circuit of the first set of resistive storage circuits via a first common exit point of a second metal rail coupled to the first set of resistive storage circuits at a second end, opposite the first end;
determine first data stored by the first resistive storage circuit of the first set of resistive storage circuits according to the first current;
apply, during a second time period, the voltage to the first common entry point;
sense, during the second time period, a second current from a second resistive storage circuit of the first set of resistive storage circuits via the first common exit point; and
determine second data stored by the second resistive storage circuit of the first set of resistive storage circuits, according to the second current.

12. The memory controller of claim 11, further configured to:
apply, during a third time period, the voltage to a third resistive storage circuit of a second set of resistive storage circuits via a second common entry point of a third metal rail coupled to a first end of the second set of resistive storage circuits;
wherein the first metal rail and the third metal rail are connected to a first global line, wherein the second metal rail and a fourth metal rail are connected to a second global line;
sense, during the third time period, a third current from the third resistive storage circuit of the second set of resistive storage circuits via a second common exit point of the fourth metal rail;
determine third data stored by the third resistive storage circuit of the second set of resistive storage circuits according to the third current;
apply, during a fourth time period, the voltage to the second common entry point;
sense, during the fourth time period, a fourth current from a fourth resistive storage circuit of the second set of resistive storage circuits via the second common exit point; and
determine fourth data stored by the fourth resistive storage circuit of the second set of resistive storage circuits, according to the fourth current.

13. The memory controller of claim 11, further comprising:
applying, by the memory controller during a third time period, a second voltage across the first resistive storage circuit; and thereafter
sensing, by the memory controller through the first common exit point of the second metal rail subsequent to the third time period, a third current from the first resistive storage circuit, the third current greater than the first current.

14. The method of claim 1, wherein determining the first data stored by the first resistive storage circuit comprises:
determining a plurality of bit values, the plurality of bit values corresponding to a plurality of resistive cells of the first resistive storage circuit.

15. A system comprising:
a first metal rail;
a second metal rail;
a first set of resistive storage circuits connected between the first metal rail and the second metal rail in parallel; and
a controller configured to:
apply, during a first time period, a voltage to a first common entry point of the first metal rail;
sense, through a first common exit point of the second metal rail during the first time period, a first current from a first resistive storage circuit of the first set of resistive storage circuits, in response to the voltage;
determine first data stored by the first resistive storage circuit of the first set of resistive storage circuits according to the first current;
apply, during a second time period, the voltage to the first common entry point;
sense, during the second time period through the first common exit point, a second current from a second resistive storage circuit of the first set of resistive storage circuits, in response to the voltage; and
determine second data stored by the second resistive storage circuit of the first set of resistive storage circuits according to the second current.

16. The system of claim 15, further comprising:
a third metal rail;
a fourth metal rail;
a second set of resistive storage circuits connected between the third metal rail and the fourth metal rail in parallel;
a first global line connected to the first metal rail and the third metal rail;
a second global line connected to the second metal rail and the fourth metal rail;
wherein the controller is configured to:
apply, during a third time period, the voltage to a second common entry point of the third metal rail;
sense, during the third time period a third current from a third resistive storage circuit of the second set of resistive storage circuits via a second common exit point of the fourth metal rail;
determine third data stored by the third resistive storage circuit of the second set of resistive storage circuits, according to the third current;
apply, during a fourth time period, the voltage to the second common entry point of the third metal rail;
sense, during the fourth time period, a fourth current from a fourth resistive storage circuit of the second set of resistive storage circuits via the second common exit point; and
determine fourth data stored by the fourth resistive storage circuit of the second set of resistive storage circuits, according to the fourth current.

17. The system of claim 15, wherein the first metal rail and the second metal rail comprise same materials.

18. The system of claim 15, wherein the first set of resistive storage circuits extend a same distance between the first metal rail and the second metal rail.

19. The system of claim 15, wherein the controller is configured to:
   apply, during a third time period, a second voltage across the first resistive storage circuit; and thereafter
   sense, through the first common exit point of the second metal rail subsequent to the third time period, a third current from the first resistive storage circuit, the third current greater than the first current.

20. The system of claim 16, further comprising:
   a first electrode of a switch coupled to a resistive cell;
   a second electrode of the switch coupled to the first metal rail; and
   a gate electrode of the switch connected to the first global line.

* * * * *